United States Patent [19]

Ma et al.

[11] Patent Number: 4,816,769
[45] Date of Patent: Mar. 28, 1989

[54] BPSK DEMODULATOR AND FM RECEIVER FOR DIGITAL DATA PAGERS

[76] Inventors: John Y. Ma, 499 Dundee Ave., Milpitas, Calif. 90535; Louis H. Jandrell, 10390 Heney Creek Pl., Cupertino, Calif. 95014

[21] Appl. No.: 3,843

[22] Filed: Jan. 16, 1987

Related U.S. Application Data

[63] Continuation-in-part of Ser. No. 748,005, Jun. 21, 1985, abandoned.

[51] Int. Cl.[4] .......................... H03D 3/18; H03D 1/04
[52] U.S. Cl. ..................................... 329/50; 329/110; 329/124; 329/134; 375/82; 375/99; 455/337
[58] Field of Search ................ 329/50, 110, 112, 122, 329/124, 126, 134; 375/81–84, 87, 99, 102–104, 120; 455/214, 337, 161, 192, 208

[56] References Cited

U.S. PATENT DOCUMENTS

| | | | |
|---|---|---|---|
| 4,174,501 | 11/1979 | Chastagnier et al. | 455/161 |
| 4,237,556 | 12/1980 | Naito | 455/208 X |
| 4,403,345 | 9/1983 | Granek et al. | 455/192 X |
| 4,580,101 | 4/1986 | Lax | 375/81 X |

Primary Examiner—Eugene R. LaRoche
Assistant Examiner—David Mis
Attorney, Agent, or Firm—Stephen G. Rudisill

[57] ABSTRACT

An FM receiver for the reception of digital data modulated on a Subsidiary Communication Authorization (SCA) subcarrier is provided with automatic tuning capability and a coherent demodulator for minimizing noise, distortion and interference. The FM receiver is tuned automatically to minimize the measured amplitude of noise and distortion at the high frequency end of the spectrum of the FM demodulator output, above the frequencies of the SCA signal. The SCA signal is tuned by a heterodyne circuit including a balanced modulator, a voltage-controlled oscillator (VCO), and a bandpass filter. The VCO is automatically tuned to maximize the measured amplitude of the SCA signal selected by the bandpass filter. For coherent detection of BPSK (Binary-Phase-Shift-Keying), the coherent demodulator is preferably and kind of data-aided Costas loop in which digital logic circuits perform phase shifting, phase detecting, a multiplying functions. The feedback of the phase error signal is preferably inhibited whenever the signal-to-noise ratio falls below the level which ensures phase-lock, for example, by inhibiting feedback whenever the amplitude of the filtered in-phase signal in the Costas loop fails to exceed a predetermined threshold level. Preferably the phase error signal is fed back through an integrating low-pass filter to control the VCO of the heterodyne circuit, and is fed back through a bandpass filter to control the oscillator of the Costas loop.

45 Claims, 5 Drawing Sheets

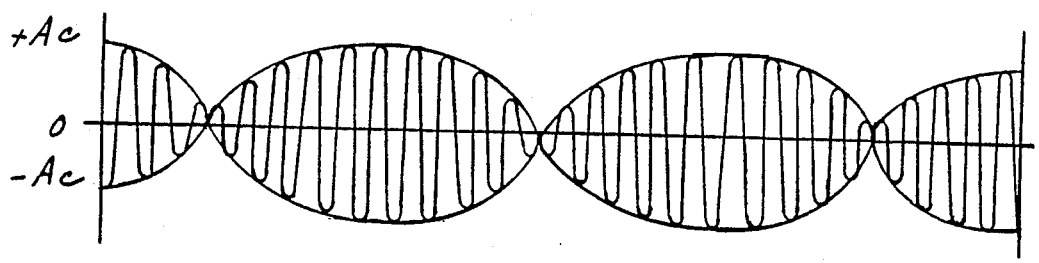
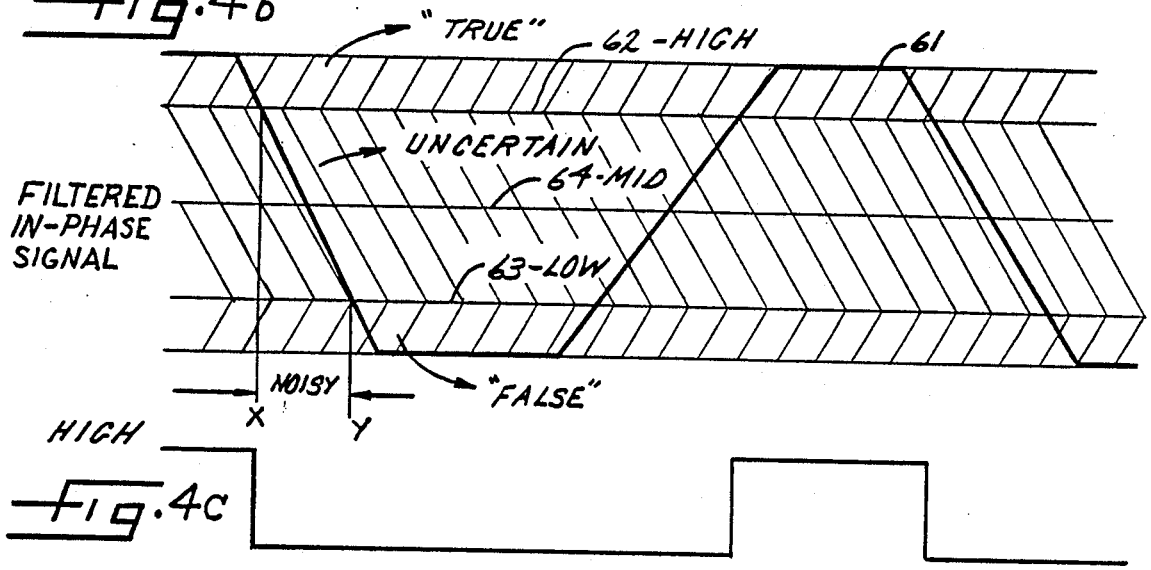
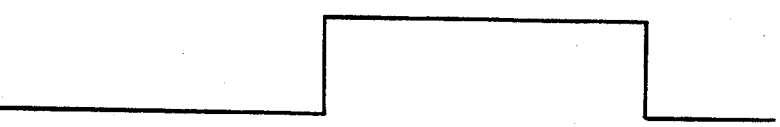
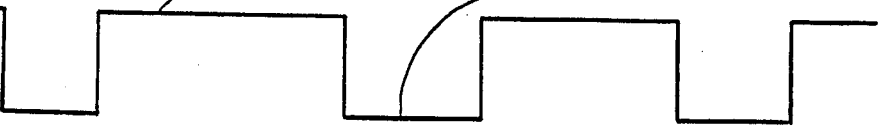

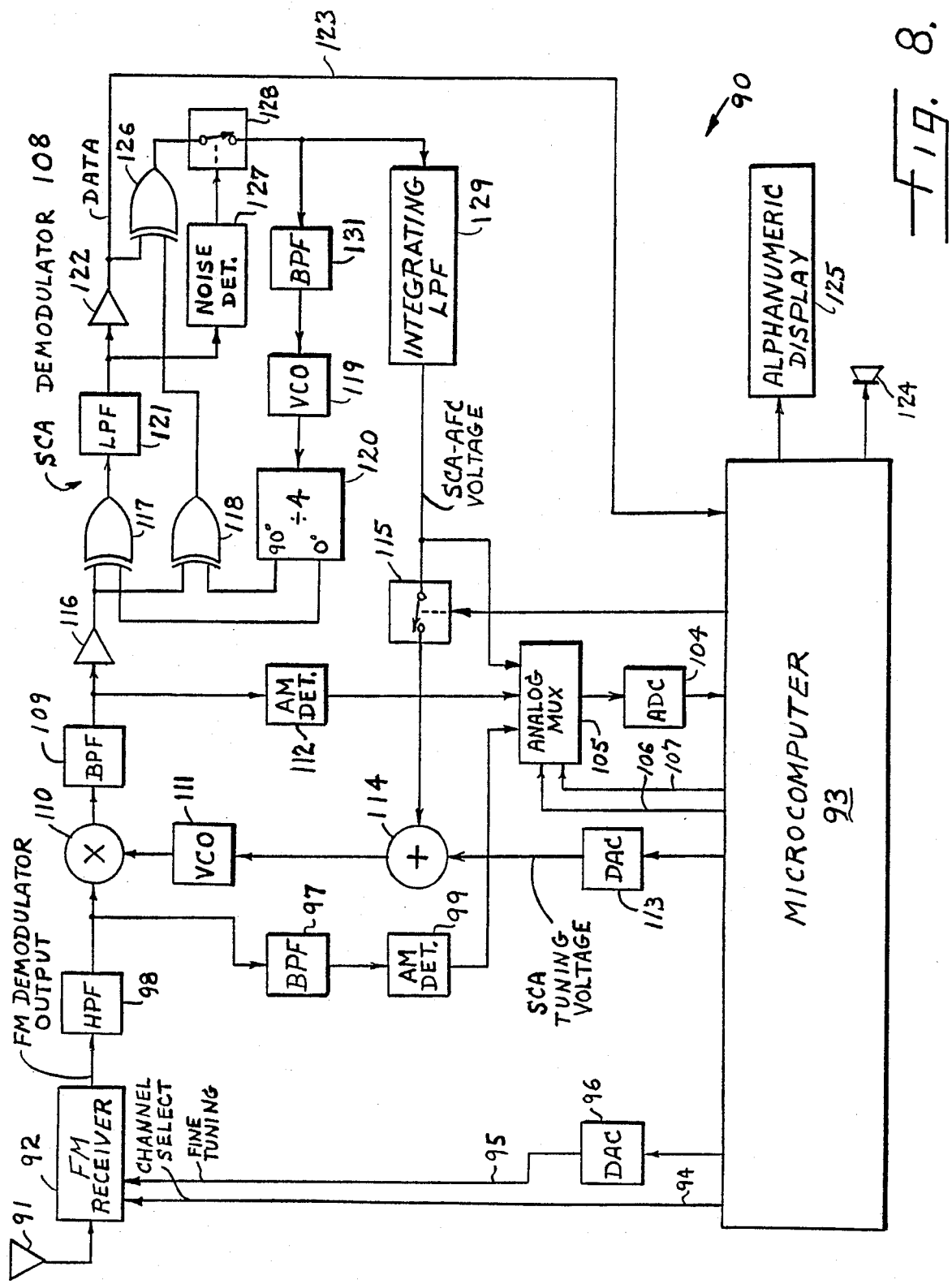

BPSK DEMODULATOR AND FM RECEIVER FOR DIGITAL DATA PAGERS

RELATED APPLICATIONS

The present application is a continuation-in-part, of U.S. application Ser. No. 748,005 filed June 21, 1985.

BACKGROUND OF THE INVENTION

This invention generally relates to receivers for digital data transmission. More specifically, the invention relates to FM broadcast digital data pagers using SCA (Subsidiary Communications Authorization) channels.

Pagers have typically used FSK (frequency-shift-keying) for digital data transmission. But BPSK (binary-phase-shift-keyed) modulation has many desirable advantages for digital data transmission including a reduced bandwidth requirement for a given data rate, minimal error rates under low signal-to-noise ratio conditions, and simple circuitry for generating the modulated signal. When coherent detection is used, BPSK also provides very reliable signal recovery in the presence of interference. However, BPSK modulation has not been used widely in paging systems because the acquisition and demodulation of the BPSK signal has required the use of more complex and expensive circuitry consuming an increased amount of power. In particular, the use of BPSK modulation in FM-SCA pagers is subject to signal acquisition and synchronization difficulties compounded by interference from the audio program material. Overcoming these disadvantages towards efficient use of BPSK modulation constitutes a significant improvement in digital data paging systems.

SUMMARY OF THE INVENTION

The general aim of the present invention is to provide an improved FM-SCA digital data paging system.

An important object of the present invention is to provide an FM-SCA digital data paging system which is capable of receiving paging information from a selected one of a number of SCA channels for a given FM broadcast station.

A specific object of the invention is to provide an FM-SCA paging system using BPSK for conveying paging information.

Another object of the invention is to provide a BPSK demodulator which has simple and inexpensive circuitry.

Yet another object is to provide such a BPSK demodulator which consumes relatively low power and hence is especially suited for use in battery operated pagers.

A further object is to provide an FM-SCA digital data paging system with an automatic tuning capability.

The present invention recognizes and solves a number of difficulties which have limited the use of coherent signalling techniques in digital paging systems in lieu of conventional FSK (frequency-shift-keying) techniques. In coherent signalling, a carrier is modulated with data in a fashion that permits the data to be coherently detected in a receiver by a comparison of the received signal with a reference carrier generated at the receiver. Although the comparison is easily performed in the receiver, for example, by using a balanced modulator, the generation of a reference carrier is a relatively complicated task, especially under low signal-to-noise conditions and in the presence of interference.

The present invention includes a number of features which enable coherent signalling to be used economically in lieu of FSK in an FM-SCA paging system. These features include a BPSK data and phase error recovery circuit using digital components for circuit integration and low-power operation, inhibition of the phase error signal during low signal-to-noise conditions for better maintenance of the reference carrier, automatic tuning of the receiver to minimize the feeding of harmonic and intermodulation distortion into the SCA signals, automatic tuning of the receiver to a desired one of a number of SCA subcarrier frequencies, and a two-step reference carrier and data recovery circuit which ensures centering of the SCA signal within a relatively narrow bandpass filter yet also provides fast acquisition of the reference carrier.

BRIEF DESCRIPTION OF THE DRAWINGS

Other objects and advantages of the will become apparent upon reading the following detailed description and upon reference to the drawings, in which:

FIGS. 4a, 4b, 4c, 4d, 4e and 4f are representations of waveforms illustrating the modulated SCA subcarrier and the operation of the improved demodulator circuitry of FIG. 3;

FIG. 8 is a schematic diagram of an FM-SCA pager receiver including circuits for automatic tuning to selected FM and SCA channels;

DESCRIPTION OF PREFERRED EMBODIMENTS

Figure 1:
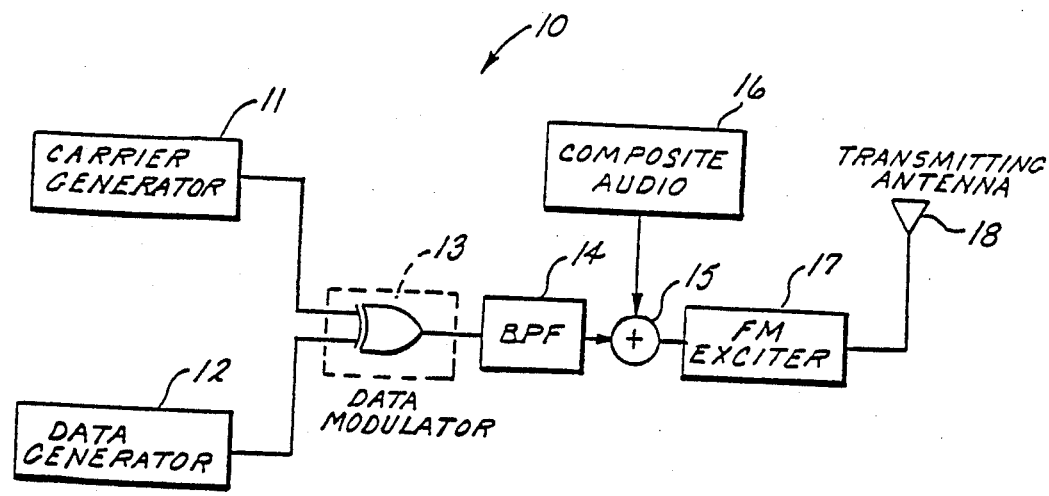
FIG. 1 is a schematic diagram of a simplified transmitter for use with the BPSK demodulator and receiver according to the invention.

Referring to the drawings, there is shown in FIG. 1 a schematic block diagram of a simplified transmitter for use with the BPSK demodulator and FM receiver according to the present invention.

The transmitter 10 has two major input source. The first input is a conventional carrier generator 11 which generates a stable carrier typically within the SCA range from 53 kHz to 95 kHz.

The second input comes from the data generator 12 which constitutes the source of the binary data to be modulated onto the carrier generated by the carrier generator 11. The data generator, for example, is a microcomputer which formats and buffers the data for a particular application. In a paging system, for example, the data generator formats the data in packets including addresses and messages intended for specified pager receivers.

Since the maximum spectral width of the modulated signal for SCA channels is 15 kHz, the maximum modulating frequency is limited to 7.5 kHz. Sufficient separation from adjacent channels has to be assured and, in view of the fact that the data rate for paging is relatively low, a typical data rate of 4800 bits per second (BPS) is sufficient and allows for ample separation.

The outputs of sources 11 and 12 are fed to the two inputs of a data modulator 13, which is shown as a conventional exclusive-OR gate. The carrier generator 11 is, for example, based on a phase-locked loop locked to a pilot tone, which is typically 19 kHz, resulting in a digital level signal at the exclusive-OR gate. The binary data produced by the data generator 12 is modulated onto the carrier by the modulator 13 in such a way that the phase of the carrier is inverted whenever the data signal is a logic high and not inverted whenever the data signal is a logic low.

The SCA signal emerging from the modulator 13 passes through a bandpass filter 14 which limits the bandwidth of the modulated signal to within 15 kHz. It is practical to use an exclusive-OR gate for the data modulator 13 only when the data rate is a small fraction of the bandwidth of the bandpass filter 14. Otherwise, it is difficult to make a bandpass filter 14 having a sufficiently linear phase response over its passband and a sufficiently symmetrical response about the carrier frequency to provide a demodulated signal which is substantially free of distortion.

If the data rate is comparable to the bandwidth of the bandpass filter 14, then a balanced modulator should be used for the data modulator 13 and the data generator 12 should provide a bandlimited signal to the balanced modulator. In this case the data generator preferably generates such a bandlimited signal by a digital finite impulse technique, for example, by constructing the bandlimited signal by digitally summing time series components of a predetermined bandlimited impulse response for the current data bit and each of a certain number of last data bits previously transmitted, wherein the impulse response component for each bit is added or subtracted depending on whether the bit is a logic one or a logic zero, respectively. In practice, all possible segments of the resultant waveform are computed and prestored in a ROM (read-only-memory), and to synthesize the resultant waveform the ROM is addressed by a counter clocked at a multiple of the data rate and a shift register receiving the data bits. When such a digital technique is used, the data modulator 13 is preferably implemented by a complement unit, which periodically and selectively complements the digital sum in accordance with the carrier frequency. Alternatively, when a ROM is used, the ROM may store both true and complement valves, which are selectively addressed by an address line clocked at the carrier frequency. A digital-to-analog converter is used to generate the SCA signal from the time-series of selectively complemented digital sums. Such digital techniques for synthesizing BPSK signals are well known.

In a subsequent stage, a mixer 15 combines the bandlimited modulated signal from the filter 14 with composite audio 16 for the main channel. The resulting composite signal is fed to a conventional FM exciter 17 which transmits the modulated composite signal from a conventional transmitting antenna 18.

Figure 2:
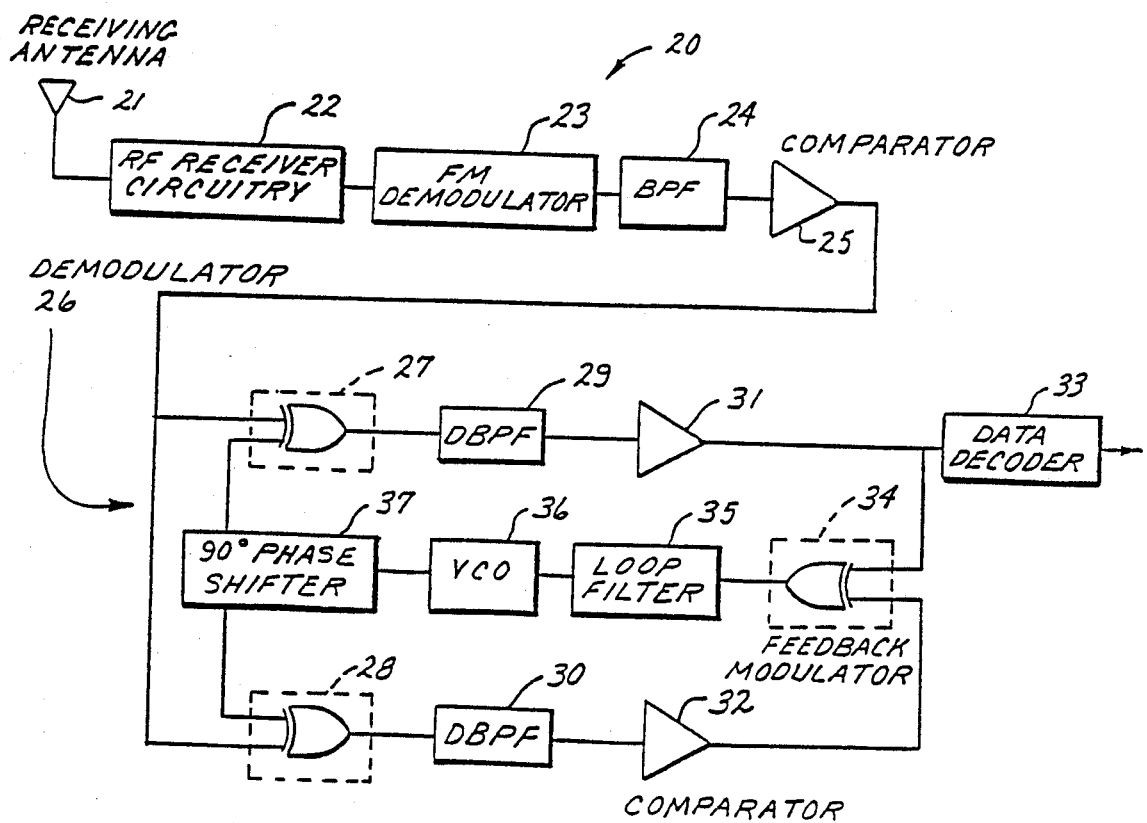
FIG. 2 is a schematic diagram of a receiver including a BPSK demodulator according to one embodiment of the invention.

Referring now to FIG. 2, there is shown a schematic of an FM receiver system 20 for receiving and demodulating a signal broadcast by the transmitter shown in FIG. 1.

The receiver system 20 captures the broadcast signal through a receiving antenna 21 working in conjunction with conventional radio-frequency receiver circuitry 22. The incoming frequency modulated signal then passes through an FM demodulator 23 which reproduces the composite audio combined with the SCA signal. A bandpass filter 24 extracts the SCA signal from the composite audio signal. The SCA signal, encoding data in the BPSK format, is hardlimited by a comparator 25.

The hardlimited BPSK signal is applied to a BPSK demodulator circuit 26. According to an important aspect of the invention, the demodulator 26 is a kind of data-aided "Costas loop" fabricated using digital components. The demodulator essentially functions as a phase-locked loop (PLL) locked on the carrier of the hardlimited BPSK signal with a voltage controlled oscillator (VCO) tracking the frequency and phase of the carrier. A data-corrected and filtered phase error voltage constrains the VCO to maintain lock with the carrier.

As shown in U.S. Pat. No. 3,101,448, the standard "Costas loop" for demodulation of double-sideband suppressed carrier modulation includes two audio channels demodulated from the same input signal but using respective local oscillator signals in phase quadrature to each other. The audio signals from the two channels are multiplied together in an audio phase discriminator to produce a DC control signal which automatically corrects for the phase error between the suppressed carrier and the reference carrier generated by the local oscillator. For demodulating a BPSK signal, the data-aided "Costas loop" has the output signal of the in-phase channel low-pass filter supplied to a hardlimiter to estimate the transmitted data. The output signal of the hardlimiter is multiplied with the output signal of the quadrature-phase low-pass filter to derive an error signal that is coupled to a loop filter, which in turn controls the frequency of the reference carrier.

The "Costas loop" demodulators described above are generally incompatible with digital logic implementation because of the signal processing which does not occur at digital logic levels. The analog implementation requires a good deal of circuit complexity and a relatively high level of power consumption. Specifically, the "Costas loop multipliers", which perform the phase detection function, involve quite complex circuitry and are currently not available as CMOS integrated circuits. The present invention removes these inherent limitations by the use of circuitry which can be implemented in conventional CMOS, resulting in very low power consumption. In particular, the BPSK demodulator according to the invention uses exclusive-OR gates to perform phase detection and multiplication.

Returning to the demodulator circuitry 26 in FIG. 2, the hardlimited BPSK signal is provided to one of the inputs of each of the two exclusive-OR gates 27 and 28 performing the phase detection. The exclusive-OR gate 27 functions as the in-phase detector whereas the exclusive-OR gate 28 functions as the quadrature-phase detector. When the demodulator is in a phase-lock condition as further described below, the output of the in-phase detector 27 is a series of narrow pulses occurring in a low or high logic level, depending on whether the received data bits are logical zeros or ones, respectively, and the output of the quadrature-phase detector 28 is a square wave at twice the frequency of the carrier of the BPSK signal and having an average value representing an estimate of the phase difference between the carrier of the BPSK signal and the phase of a reference carrier. The outputs of the two detectors 27 and 28 are applied to identical data bandpass or low-pass filters 29 and 30 respectively, which have a bandwidth sufficient to pass the received data signals. The filtered signals are applied to identical comparators 31 and 32 respectively, which hardlimit the signals to high and low logic levels by performing a comparison with respect to a predefined threshold level.

The output from the comparator 31 is the recovered data and is fed to a conventional data decoder 33 which includes, for example, a conventional microprocessor and appropriate software. For a pager receiver, the microprocessor is programmed, for example, to resolve the ambiguous polarity of the recovered data signal by recognizing synchronization characters originally included within the binary data stream by the data generator of FIG. 1, and to display data messages intended for the specific pager receiver when an address code in the data matches a pre-programmed address for the pager receiver. The ambiguous polarity of the recovered data signal results from the fact that the demodulator may generate a reference carrier which is either in phase or 180° out-of-phase with respect to the carrier of the BPSK signal.

The output of the comparator 32 is an error signal resulting from the phase detection by the quadrature-phase detector 28, but the polarity of this error signal is the exclusive-OR of the polarity of the reference carrier phase error and the logical value of the transmitted data. To obtain the proper polarity of the reference carrier phase error, both the recovered data signal and the output of the comparator 32 are applied to another exclusive-OR gate 34 which functions as a feedback modulator to invert the error signal whenever the recovered data is a logical 1.

The phase error signal from the feedback-modulating exclusive-OR gate is passed through a loop filter 35 and then applied to the control terminals of a conventional voltage-controlled oscillator (VCO) 36 operating at a set free-running frequency $f_0$. In this manner, the phase error signal forces the frequency of the VCO 36 to vary in a direction which reduces the difference between the phase of the carrier of the hardlimited BPSK signal and the phase of the reference carrier fed from the phase shifter 37 to the in-phase detector 27.

If the VCO frequency $f_s$ for carrier frequency synchronization is sufficiently close to the free-running frequency $f_0$, the feedback of the phase error signal causes the VCO 36 to synchronize or "lock" with the BPSK signal. Once "lock" has been established, the feedback of the phase error signal causes the VCO to track frequency and phase changes of the BPSK signal.

In the embodiment of FIG. 2 the modulation of the polarity of the feedback signal, as performed by the exclusive-OR gate 34, forces the VCO 36 to track the phase of the carrier for both phases of the modulation by the data. Since the demodulator can initially lock onto either of the two phases of the modulated carrier, the sense of the recovered data (i.e., whether a logical one is asserted high or low) is not known until it is extracted from the content of the data (for example, by recognition of synchronization codes or by differential decoding).

The output of the VCO 36 is fed to a phase shifter 37 which produces an in-phase output which is applied to the second input of the in-phase detector exclusive-OR gate 27, and a quadrature phase output which is applied to the second input of the quadrature-phase detector exclusive-OR gate 28. Preferably the phase shifter 37 includes a two-stage binary counter, such as the counter 54 shown and described below in connection with FIG. 3.

Adaptations of the "Costas loop" type of circuit for demodulation purposes suffer from the recurring problem of false tracking (i.e., cycle slip) and loss of phase lock by the VCO in noisy environments. This is a common problem with coherent detection; the performance of the coherent detector at low signal-to-noise conditions is dependent upon the ability of the detector to maintain the phase of the reference carrier through bursts of noise. Pagers and other mobile receivers suffer from the additional disadvantage that noise bursts occur at somewhat regular intervals as the receiver is moved through nulls in the radiation field caused by multi-path propagation from the transmitter to the receiver.

As described above with reference to FIG. 2, the recovered data signal is fed to the exclusive-OR gate 34 to switch the polarity of the phase error signal feedback to the VCO 36 when the data changes, thereby enabling the VCO to track the unmodulated carrier phase. However, under excessively noisy conditions, the data assisting signal actually begins to degrade the maintenance of the phase of the reference carrier. This is due to the fact that, during the presence of a noise burst, the polarity of the phase error signal is reversed by errors in the received data and consequently the phase of the VCO is driven away from the proper value. If phase-lock is lost, a considerable amount of time is required for lock to be re-established once a good signal is received.

Figure 3:
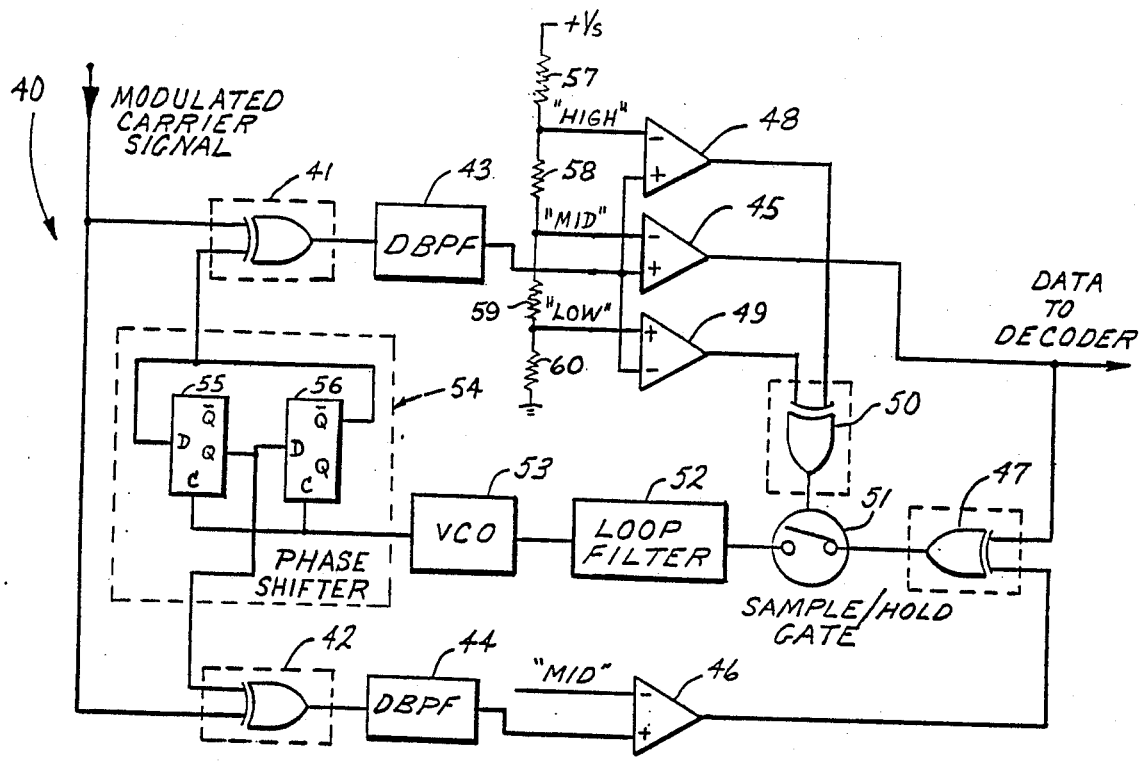
FIG. 3 is a schematic diagram of another embodiment of the BPSK demodulator which includes improvements to the receiving system of FIG. 2 for maintaining a coherent reference carrier.

FIG. 3 shows a block diagram illustration of another embodiment of the BPSK demodulator of the present invention including improvements for reducing the possibility of false tracking and loss of phase lock by the VCO. In general terms, feedback of the phase error signal is inhibited under low signal-to-noise conditions detected in response to the filtered in-phase signal. More specifically, a sampling gate in the feedback loop is disabled by additional discriminators whenever the discriminators determine that the filtered in-phase signal is not at defined logic levels. Such an arrangement significantly improves the demodulation performance under low signal-to-noise ratio conditions.

Referring to FIG. 3, the demodulator circuit 40 accepts at its input the hardlimited BPSK modulated carrier signal recovered by the initial stages such as the receiving antenna, the r.f. receiver circuitry, the FM demodulator, the bandpass filter and the comparator of the receiver system of FIG. 2. This BPSK modulated signal is provided to one of the inputs of each of two exclusive-OR gates 41 and 42 performing the phase detection. The exclusive-OR gate 41 functions as the in-phase phase detector whereas the exclusive-OR gate 42 functions as the quadrature-phase phase detector. As in the case of the system shown in FIG. 2, the outputs of the two detectors 41 and 42 are applied to identical data bandpass or low-pass filters 43 and 44, respectively, and the filtered signals are applied to identical comparators 45 and 46, respectively, which hardlimit the signals to high and low logic levels by performing a comparison with respect to a pre-defined middle threshold level "MID".

The output from the comparator 45 represents recovered data which is available for decoding, and as described above, the ambiguous polarity of the recovered data signal is resolved by using a conventional data decoder which includes, for example, a conventional microprocessor programmed to search for synchronization characters included in the transmitted data stream. The output of the comparator 46 is an error signal which is fed, along with the recovered data signal, to an exclusive-OR gate 47 which provides a phase error signal.

According to an important feature of the invention, there is provided a means for ensuring that the recovered data affects the feedback loop only if the data signal is at well defined logic levels. This is accomplished in the embodiment of FIG. 3 by the provision of two additional comparators 48 and 49 controlled by the in-phase signal emerging from the filter 43. The outputs of these comparators are applied to another exclusive-OR gate 50, whose output in turn serves to control a sample/hold gate 51. The additional comparators serve to disable the sample/hold gate 51 whenever the filtered in-phase signal is not at the defined logic levels. More specifically, the comparator 48 compares the filtered in-phase signal with a pre-defined threshold level "HIGH" and produces an output if the filtered in-phase signal exceeds the "HIGH" level, and the comparator 49 compares the filtered in-phase signal with a pre-defined threshold level "LOW" and produces an output if the filtered in-phase signal falls below the "LOW" level.

The exclusive-OR gate 50 actually functions as an OR gate to enable the sample/hold gate 51 when the comparator 48 indicates that the filtered in-phase signal exceeds the "HIGH" threshold, or when the comparator 49 indicates that the filtered in-phase signal falls below the "LOW" threshold; in either case, the amplitude of the filtered in-phase signal exceeds a certain level. An exclusive-OR gate is used instead of an OR gate because the four exclusive-OR gates 41, 42, 47, 50 are included in the same standard CMOS integrated circuit (e.g., part No. 4030).

The sample/hold gate is, for example, an analog transmission gate, such as a field-effect transistor or CMOS integrated circuit such as part No. 4016. The gate is conductive or closed to sample the phase error signal when its control input is at a logic high.

The error signal at the output of the exclusive-OR gate 47 therefore proceeds through the sample/hold gate 51 of the feedback loop only when the filtered in-phase signal is at the defined logic levels. The error signal is then passed through a loop filter 52 and applied to the control terminals of a voltage-controlled oscillator 53 which performs the "locking" and "tracking" functions already described above.

Figure 5:
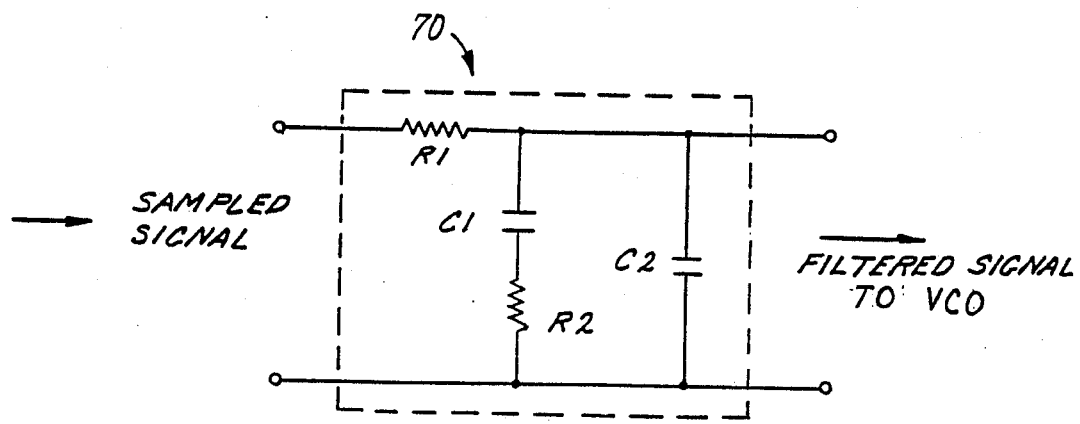
FIG. 5 is a typical configuration of a low-pass loop filter for use with the demodulator circuitry in FIGS. 2 and 3.

The loop filter 52 is a conventional low-pass filter which is also capable of holding a sampled signal for a reasonable amount of time by virtue of a large decay time of its shunt capacitances. FIG. 5 shows a typical configuration of such a low-pass filter 70 which includes a series resistance $R_1$, a shunt arm with a resistance $R_2$ and capacitance $C_1$, and a shunt capacitance $C_2$. The capacitors preserve the sampled value to provide true sampling of the filtered signal. The design of such a low-pass filter is well known. In particular, the component values of the low-pass filter 70 are selected so that the "loop bandwidth" of the phase tracking loop including the VCO 53 should be about 0.1% to 1% of the data rate. For digital paging, such a narrow loop bandwidth requires rather precise frequency control, such as crystal control of the SCA carrier frequency and the frequency of the VCO 53. As described below in connection with FIG. 8, the circuit of FIG. 3 can be modified (for example, by eliminating the quadrature-phase data filter 44 and the quadratur-phase comparator 46) to minimize the frequency control requirements.

The output of the VCO 53 is fed to a digital phase shifter 54 which produces an in-phase output which is applied to the second input of the in-phase detector exclusive-OR gate 41 and a quadrature-phase output which is applied to the second input of the quadrature phase detector exclusive-OR gate 42.

According to a feature of the invention, the digital phase shifter 54 is implemented by a two-stage binary ring counter which produces in-phase and quadrature-phase outputs at one quarter of the frequency of the VCO. Therefore, the free-run frequency $f_o$ of the VCO is adjusted to four times the frequency of the carrier of the BPSK signal. The two-stage binary ring counter 54 includes two flip-flops, such as the D flip-flops 55, 56 shown in FIG. 3.

The demodulator circuit of FIG. 3 provides markedly increased reliability under low signal-to-noise ratio conditions by preventing error signal feedback during the time that the filtered in-phase signal is not at the defined logic levels. Although the filtered in-phase signal shifts from the defined logic levels during the normal switching interval, this does not normally cause a problem because the transition occurs quickly enough under good signal-to-noise ratio conditions.

FIG. 4 is a representation of waveforms showing the modulated carrier signal and the operation of the sampled-data section of the demodulator circuitry of FIG. 3. The pre-defined threshold levels used for the discrimination of noise within the modulated signal are also shown. These threshold levels are established, for example, by a voltage divider including resistors 57, 58, 59 and 60 in FIG. 3. For the threshold levels shown, the values of resistors 57 and 60 are identical, and the values of resistors 58 and 59 are identical and about twice the values of resistors 57 and 60.

In FIG. 4(a), the BPSK modulated carrier 60 has its phase switched, on the basis of the modulating binary data, between two discrete and equispaced values corresponding to a digital "one" and a digital "zero", respectively. The BPSK modulation system uses phase angles of "0" and "$\pi$" radians and the modulated BPSK wave is represented by the expression:

$$X_c(t) = A_c \text{Cos}(\omega_c t + \Phi_j); \quad \Phi_j = 0 \text{ or } \Pi$$
$$= A_j \text{Cos} \omega_c t; \quad A_j = \pm A_c$$

When the hardlimited modulated carrier signal passes through the in-phase detector 41 and the following filter 43 of FIG. 3, the resulting output is in the form of the waveform 61 in FIG. 4(b). When the filtered in-phase signal is at or above the threshold "HIGH" 62, it is said to be logically "TRUE" and when the filtered in-phase signal is at or below the threshold level "LOW" 63, it is said to be logically "FALSE" When the filtered in-phase signal is between the "HIGH" and the "LOW" thresholds, its logic sense (as estimated by the midrange comparator 45) is very likely erroneous due to noise and hence within this region the logic sense of the filtered in-phase signal is said to be "UNCERTAIN".

In the absence of noisy conditions the filtered in-phase signal maintains transitions uniformly about the "HIGH" 62 and "LOW" 63 thresholds, with an average value at the "MID" level 64. However, the presence of noise causes random fluctuations in the filtered in-phase signal leading to a stretching of the transition period. In FIG. 4(b), the transition period is the area between points "X" and "Y" and is proportional to the slope of the filtered in-phase signal during transitions. If this transition period is extended, the polarity of the phase error signal can become reversed from the true value of the phase error for a sufficient time for the recovered data to be inverted and cause the VCO 36 to start tracking the opposite phase or become unlocked entirely from the frequency of the carrier of the hardlimited BPSK signal. As long as the transition of the filtered in-phase signal between the "HIGH" and "LOW" thresholds takes place quickly, the feedback modulation as described above with reference to FIG. 2 contributes to the accurate tracking of the BPSK carrier.

The waveform in FIG. 4(c) represents the output of the "HIGH" level comparator 48 of the system of FIG. 3. As shown, the output of the comparator is active whenever the filtered in-phase signal is above a predefined threshold level "HIGH" and goes low whenever the in-phase signal falls below the pre-defined "HIGH" level.

The waveform in FIG. 4(d) represents the output of the "LOW" level comparator 49 of the system of FIG. 3. The output in this case is active whenever the filtered in-phase signal is below a pre-defined threshold "LOW" and goes low whenever the in-phase signal exceeds the predefined "LOW" level.

In FIG. 4(e), the waveform represents the action of the "MID" level-comparator which indicates the recovered data. The recovered data is a logic high or a logic low depending upon whether the filtered in-phase signal is respectively greater or less than the pre-defined threshold level "MID". When the noise level increases to reduce the signal-to-noise ratio significantly, however, the comparator output is no longer a reliable indication of the transmitted data and instead is ruled by the random fluctuations of the filtered in-phase signal due to noise.

In FIG. 4(f), the waveform represents the action of the Sample/Hold gate 51 as controlled by the exclusive-OR gate 50 in FIG. 3. The exclusive-OR gate produces an output which is active whenever one (but not both) of the comparator outputs is high. The control signal to the Sample/Hold gate causes the Sample-Hold gate to be closed or in the "Sample" state whenever the exclusive-OR gate is active and to be open or in the "Hold" state when the exclusive-OR gate is inactive. More specifically, the Sample/Hold gate "samples" the phase error signal whenever the filtered in-phase signal is beyond the discrete logic levels "HIGH" or "LOW" and it "holds" the preceding phase error signal whenever the filtered in-phase signal falls in between the logic levels "HIGH" and "LOW". Hence when the filtered in-phase signal is in the "UNCERTAIN" region shown in FIG. 4(b), the Sample/Hold gate is open and the loop filter following the gate continues holding the averaged values of the error signals previously sampled.

In this way, during the noisy data portions indicated by the extended transition periods of the filtered in-phase signal, the VCO of FIG. 3 continues to track the carrier frequency rather than be affected by an erroneous or noisy phase error signal. In effect, the Sample/Hold gate is enabled or "ON" as long as the signal-to-noise ratio stays high and is disabled or "OFF" whenever the signal-to-noise ratio goes low as determined by the "HIGH" and "LOW" comparator actions described above. The portions of the hardlimited BPSK signal, the in-phase signal, and the quadrature-phase signal near the phase reversals in the BPSK signal are relatively noisy because the amplitude of the BPSK signal, before hardlimiting, goes to zero at these phase transitions, and the hardlimiter boosts the reduced signal and the noise near the transitions by whatever amount of gain is needed so that the amplitude of the hardlimited signal becomes uniform.

The above action of the sample/hold gate contributes to a high reliability of demodulation even in the presence of very low signal-to-noise ratio conditions. For a given error rate, this action was found to decrease the noise sensitivity of the system of this invention by a factor of up to 3 dB.

It will be understood that the noise discriminating action provided, according to a feature of this invention, by the "HIGH", "MID" and "LOW" level comparators, the exclusive-OR gate 50 and the sample/hold gate 51 is not limited to use with the demodulator circuitry of the shown preferred embodiments but is equally applicable to other cases of phase error estimation, and in particular data-aided recovery of a reference carrier.

Up to this point it has been assumed that the circuits in the FM-SCA receiver have been properly tuned to receive the FM-SCA signal. For the receiver of FIG. 2, for example, it has been assumed that the RF receiver circuitry 22 has been tuned to the frequency of the FM carrier, and the bandpass filter 24 and the VCO 36 have been tuned to the frequency of the SCA subcarrier. If the receiver of FIG. 2 were intended to receive signals having only a single FM carrier frequency and SCA subcarrier frequency, then tuning of the receiver would present no appreciable difficulty, since the receiver could be tuned during assembly to provide optimum reception, and frequency stability could be assured by using crystal or ceramic resonators. In practice, however, it is most desirable for the receiver to have an automatic tuning capability, so that it is possible for the receiver to tune itself to FM-SCA transmitters which provide the strongest signals in the location of the receiver at any given instant of time. In a paging system this is desirable not only to ensure that paging messages are received with minimal interference or error at any given location, but also to ensure relatively continuous reception as the receiver is moved from the reception area of one FM-SCA transmitter to another. Automatic tuning is further desirable to permit the FM broadcast stations to have the flexibility of adding SCA paging subcarriers to presently available subcarrier frequencies.

It has been discovered, however, that the tuning of the FM-SCA receiver is especially important for obtaining the best possible reception, due to the degree of distortion introduced into the signal by phase non-linearities of improperly tuned filters. Of the greatest importance is the phase linearity of the IF filters in the FM receiver, since any phase distortion introduced into the FM signal between the modulator and the demodulator is converted into amplitude distortion during the demodulation process. The amplitude distortion in turn causes harmonics and intermodulation products of signals from the audio and multiplexed stereo audio frequencies to become shifted into the frequencies allocated for the modulated SCA subcarriers.

Figure 6:
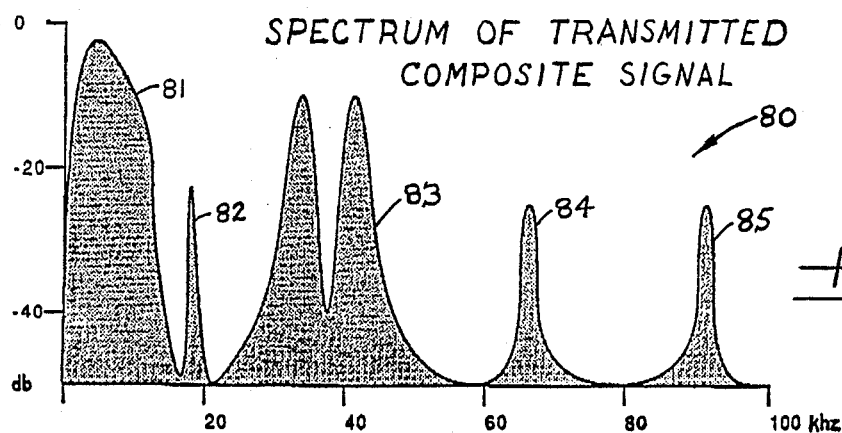
FIG. 6 is a graph of the spectrum of a composite signal for FM modulation and transmission including multiplexed stereo audio channels, a 19 kHz pilot tone, and modulated SCA subcarriers at 67 and 92 kHz.

Turning now to FIG. 6, there is shown a typical spectrum of the composite signal which is used to modulate the FM carrier in an FM transmitter such as the transmitter 10 shown in FIG. 1. The spectrum generally designated 80 includes the monaural audio or "L+R" signal 81 extending from about 20 Hz to 15 kHz, a pilot tone 82 at 19 kHz to assist stereo multiplex decoding, the "L-R" audio signals 83 modulated on a suppressed carrier of 38 kHz and extending from about 23 to 53 kHz, a modulated SCA subcarrier 84 at 67 kHz, and a modulated SCA subcarrier 85 at 92 kHz.

After FM modulation, transmission, and reception and demodulation at the receiver, the spectrum of the composite signal becomes distorted due to noise, limited transmission bandwidth, and amplitude distortion due to multipath propagation and phase distortion. The cumulative affect of these distortions results in the spectrum 86 shown in FIG. 7. Of particular importance is the fact that the distortion 87 at the higher frequencies is relatively high compared to the power of the modulated SCA subcarriers. Although the distortion itself is relatively small compared to the total power of the composite signal, the power of the modulated SCA subcarrier must also be relatively small to comply with the rules of the FCC (Federal Communications Commission).

It has been found that one way to minimize the undesirable effect of phase distortion in the IF filters is to tune the FM receiver so that the FM carrier signal falls in the "geometric center" of the filter passband. The "geometric center" is defined as that position where the high side and low side sidebands of the FM signal are most equally balanced, so that the distortion is minimized. This method works best when the filter amplitude and phase response characteristics are symmetrical about the center of the frequency response of the filter. When the frequency response of the filter is not symmetrical, then the distortion cannot easily be minimized, because the minimum does not occur at a sharply defined frequency. Furthermore, the FM carrier frequency for minimum noise and distortion does not necessarily fall at the FM carrier frequency for maximum received signal strength, or in other words, the maximum response for the filter. Therefore, the preferred strategy for automatic tuning of the FM receiver should be based on a measure of the noise and distortion, rather than a measure of the signal strength.

A preferred automatic tuning method is to use a 10 kilohertz wide bandpass filter centered at about 110 kHz to select noise and distortion in the composite signal after FM demodulation. The selected noise and distortion is measured by an amplitude modulation detector which gives an output voltage proportional to the amplitude of the total noise and distortion selected by the bandpass filter. Initially, when the FM receiver is not tuned to any FM station, the output of the amplitude modulation detector will only be an estimate of the noise in the composite signal from FM demodulation, but the output will decline as the receiver is tuned to an FM station. As the FM signal sweeps through the IF filter passband as the FM receiver becomes tuned to the FM station, however, the distortion caused by both phase non-linearity and amplitude asymmetry of primarily the IF-filter will cause the composite signal from FM demodulation to be rich in distortion products mainly due to distortion of-the "L-R" signal (84 and FIG. 7). These distortion products become detected by the amplitude modulation detector, causing the output of the detector to substantially increase. Tuning of the FM receiver is continued until the noise and distortion indicated by the amplitude modulation detector is a minimum, or is at least below a level which will yield acceptable recovery of the data modulated onto the SCA subcarriers.

A preferred embodiment of an FM pager receiver including circuits for automatic tuning is shown in FIG. 8. The receiver generally designated 90 includes an FM receiving antenna 91 and an FM receiver 92 including RF receiver circuitry and an FM demodulator, as well as circuits for scanning the FM broadcast band. It should be recognized, therefore, that the FM receiver 92 can be any of number of commercially available FM receivers having a channel scan or seek capability, as are widely used in automotive and high fidelity FM receivers. The FM receiver is operated by a microcomputer via a channel select line 94 over which the microcomputer 93 transmits a signal to select a new FM channel. The channel select signal could be a single pulse to command the FM receiver to scan to the next FM channel. Alternatively, for example, if the FM receiver includes a digital frequency synthesizer for channel selection, the channel select signal could be a digital signal which commands the FM receiver to tune any desired FM frequency.

For fine tuning the FM receiver so that a minimum of noise and distortion appears in the FM demodulator output, the FM receiver has a fine tuning input which, for example, is an input to the automatic frequency control of the FM receiver. The fine tuning voltage on the input 95 is provided by a digital-to-analog converter 96 responsive to a number set by the microcomputer 93.

For sensing the amount of noise and distortion in the FM demodulator output, the receiver 90 includes, as mentioned above, a bandpass filter 97 centered at about 110 kHz and having a bandwidth of 10 kHz. The FM demodulator output, however, is not directly fed to the bandpass filter 97, but instead is fed through a high-pass filter 98 for rejecting the audio information and, in the case of a stereo FM broadcast station, also rejecting the pilot carrier and "L-R" signals. Although this is not necessary for detecting the noise and distortion, the high-pass filter 98 is used primarily for pre-selecting any SCA signals. Therefore, the high-pass filter preferably has a lower cutoff frequency of about 50 kHz.

Figure 9:
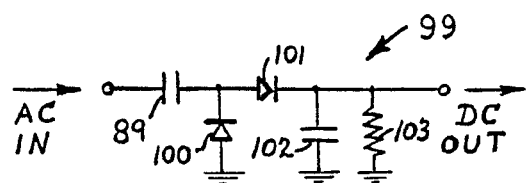
FIG. 9 is a schematic diagram of an amplitude modulation detector of the kind used in connection with tuning the FM receiver for minimum noise, and with tuning the SCA subcarrier selector for a maximum signal strength.

The noise and distortion selected by the bandpass filter, 97 is detected by an amplitude modulation detector 99. A schematic diagram of the amplitude modulation detector is shown in FIG. 9. The detector 99 includes an AC coupling capacitor 89, a first directional diode 100 which clamps the coupled AC signal to ground, a second directional diode 101 for rectifying the AC signal, a smoothing capacitor 102, and a resistor 103 for slowly discharging the smoothing capacitor 102.

Returning now to FIG. 8, the output signal from the amplitude modulation detector 99 is sensed by the microcomputer 93 so that the microcomputer may operate the digital-to-analog converter 96 to obtain a minimum indication from the amplitude modulation detector. In order to convert the analog output of the amplitude modulation detector to a digital number for processing by the microcomputer 93, the receiver 90 includes an analog-to-digital converter 104. So that this analog-to-digital converter may be used by the microcomputer to read a number of analog signals, there is provided an analog multiplexer 105 for selecting a particular analog signal to be sensed at any given time. The microcomputer sends a select number over input lines 106 and 107 to command the analog multiplexer to select a desired analog signal for conversion by the analog-to-digital converter 104.

The microcomputer 93 initiates the scanning and fine tuning of the FM receiver when the receiver 90 is first turned on, or when it is unable, after a predetermined amount of time, to successfully tune and demodulate an SCA signal including paging information, as further described below. The unsuccessful tuning could be due to any number of reasons, including the absence of a strong FM signal at the selected station, the fact that the selected station does not transmit an SCA signal, or the fact that the SCA signal transmitted by the selected station does not conform to the format intended for the receiver 90.

In any case, once the microcomputer has been unsuccessful in receiving paging information from the currently selected channel, it sends a signal from line 94 so that the FM receiver will scan to the next FM station, and it also sets the digital-to-analog converter 96 to a mid-range value. Then, the microcomputer 93 sends selecting signals along lines 106 and 107 so that the multiplexer 105 selects the analog signal from the amplitude modulation detector 98.

After a predetermined amount of time required for the FM receiver to tune the next channel, the microcomputer reads the analog-to-digital converter 104 to obtain the value of the noise and distortion detected by the amplitude modulation detector. This value is recorded in the microcomputer's memory, and the digital-to-analog converter 96 is changed, either up or down in sequence, to the next value from its mid-range in an attempt to obtain a lower noise reading from the analog-to-digital converter 104. If a lower noise value is received, the digital-to-analog converter 96 is set to its next value in an attempt to obtain an even lower noise reading. Otherwise, if a higher noise reading is obtained, the setting of the digital-to-analog converter is changed in the other direction in an attempt to obtain the minimum noise value. The microcomputer continues executing these steps until a lower noise reading cannot be obtained, and the analog-to-digital converter is set back to the setting giving the lowest noise readings.

To check the strength of the FM signal, the minimum value having been recorded in memory is compared to a predetermined threshold. If the minimum value exceeds the predetermined value, then the FM station is considered too weak in signal strength for demodulation, and therefore the microcomputer sends a new channel select signal along line 94 to continue the channel selecting process. Otherwise, an FM station of sufficient signal strength has been found and the microcomputer executes a procedure for selecting an SCA signal for demodulation.

Figure 7:
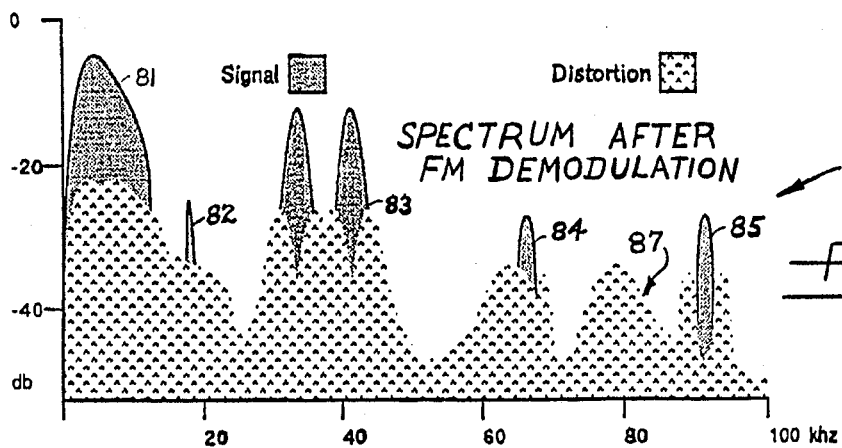
FIG. 7 is a graph of the spectrum of the composite signal of FIG. 6 after radio-frequency reception and FM demodulation, and showing the distortion that is introduced by phase non-linearities of the RF and IF filters in the FM receiver.

In order to select a particular one of a number of SCA signals, such as either one of the two SCA modulated subcarriers 84 or 85 in FIG. 7, the receiver 90 of FIG. 8 employs circuits for heterodyne detection of the SCA signal. By using a heterodyne technique, the SCA demodulator 108, including a bandpass filter 109, can be designed and optimized for a single fixed frequency, while the receiver 90 can be tuned for the demodulation of a selected one of a number of SCA signals at different frequencies.

In order to perform the heterodyne process, a balanced mixer 110 multiplies the output of the high-pass filter 98 with a carrier signal generated by a heterodyne voltage controlled oscillator (VCO) 111. The high-pass filter 98 partly suppresses the level of the audio and stereo information prior to mixing. This reduces cross modulation products in the mixer 110, which is desirable since the level of the audio and stereo information is typically 25 dB or more above the SCA signals.

In order to provide ease of tuning of the VCO for the demodulation of SCA subcarriers from about 56 to about 94 kHz, the frequency of the VCO is set much higher than the frequencies of the SCA signals to thereby perform an up conversion process. It is desirable to use a 455 kHz bandpass filter, plus or minus 6 kHz, for the bandpass filter 109, since such filters are commercially available for use as IF filters for AM radio receivers. Therefore, the VCO is preferably tunable from 505 to 555 kHz. Since the tuning range of the VCO is only about 10 percent of its center range frequency, the voltage controlled oscillator is readily available and, for example, is merely a conventional L-C oscillator having a varactor diode for voltage control of the frequency of oscillation.

So that the microcomputer 93 can automatically tune the SCA demodulator for maximum strength of the desired SCA signal, the strength of the selected signal is detected by an amplitude modulation detector 112. The amplitude modulation detector 112 is similar in construction to the amplitude modulation detector 98 shown in FIG. 9. The output of the amplitude modulation detector 112 is fed to the analog multiplexer 105 so that the output can be read by the microcomputer 93.

In order to tune the receiver 90 for reception of a desired SCA signal, the receiver 90 includes a digital-to-analog converter 113 for generating an SCA tuning voltage in response to numercial values set by the microcomputer. The SCA tuning voltage is fed to the heterodyne VCO 111 via a summing junction or amplifier 114 which is used to combine an automatic frequency control voltage which is used, as further described below, to obtain phase lock for coherent detection of the SCA signal. For initially tuning the receiver 90 to the desired SCA signal, however, a gate 115 is open to disconnect the SCA-AFC voltage from the summing junction 114. The gate 115 is, for example, a CMOS analog transmission gate, such as part No. 4016.

In a fashion similar to that described above for tuning the FM receiver for minimum noise, the microcomputer sends values to the digital-to-analog converter 113 for maximizing the signal indication by the amplitude modulation detector 112. The digital-to-analog converter 113, however, need not be initially set to its mid-range value, but instead can be initially set for tuning a first one of a number of pre-assigned frequencies for the SCA subcarriers.

The SCA demodulator 108 is similar to the demodulator 40 in FIG. 3. The selected SCA signal is hardlimited by a comparator 116 and the hardlimited SCA signal is fed to an in-phase exclusive-OR gate 117 and a quadrature-phase exclusive-OR gate 118. These exclusive-OR gates also receive respective in-phase and quadrature-phase modulating signals from a demodulator VCO 119 and a 90 degree phase shifter 120. The in-phase signal from the exclusive-OR gate 117 is again fed through a low-pass filter 121 and hardlimited by a comparator 122 to provide the demodulated data which is fed along a line 123 to the microcomputer 93 to be further decoded as described above. When the microcomputer finds an address in the data corresponding to a pre-programmed address for the particular pager 90, then the user of the pager is alerted by a beep from a piezoelectric tone emitter 124 and a corresponding message is displayed to the user on an alphanumeric display 125.

One advantage of using a bandpass filter 109 at the standard 455 kHz frequency is that a good deal of selectivity is provided by the bandpass filter, and additionally the frequency of the carrier is very much greater than the data rate. Therefore, the low-pass filter 121 need not be used to eliminate noise from the in-phase signal, but need only eliminate the product signals occurring at about 455 kHz. A simple RC low-pass filter having a cutoff frequency of 5 kHz could be used. As shown in FIG. 8, the quadrature-phase signal is fed directly to a third exclusive-OR gate 126 where its polarity is selectively inverted in response to the data to generate a phase error signal. Due to the fact that there is not a low-pass filter in the quadrature-phase channel, the phase error signal will be incorrect for about the time delay through the filter 121 after each phase reversal in the hardlimited BSPK signal. This is, however, mostly compensated for by the operation of the noise detector 127.

Since the low-pass filter 121 has a relatively short time delay, the phase error signal will be incorrect only during the times of the transitions in the filtered in-phase signal, and consequently a noise detector 127 may be used to operate a sample/hold gate 128 to inhibit feedback of the phase error signal over intervals which include the short time intervals during which the phase error signal is incorrect. Due to the fact that the bandpass filter 109 has a good deal of selectivity, however, and due to the fact that the low-pass filter 121 may have a short time delay, it has been found that the SCA demodulator 108 can still perform satisfactorily even if the noise detector 127 and the sample/hold gate 128 are removed. As is evidenced by comparison of FIG. 8 to FIG. 3, the noise detector 127 includes a pair of comparators for comparing the in-phase signal to high and low thresholds, and a logical OR gate for combining the comparator outputs to provide the control signal for enabling the sample/hold gate 128.

Figure 10:
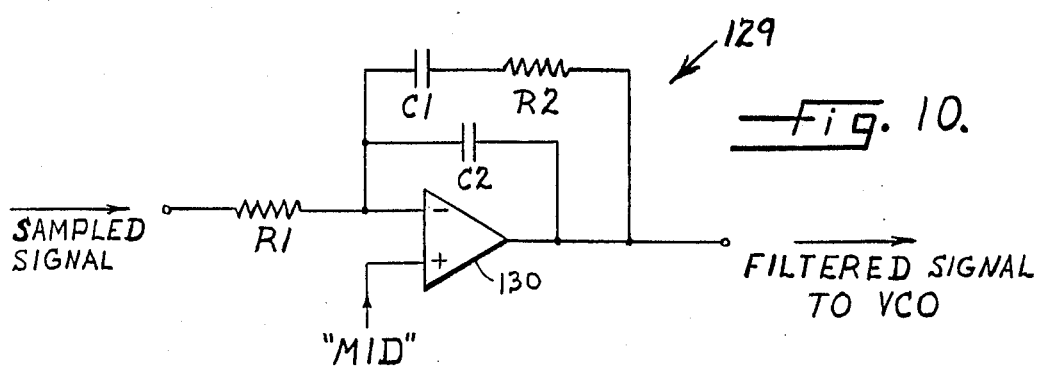
FIG. 10 is a schematic diagram of an integrating low-pass filter used for ensuring a minimal phase offset error between the SCA subcarrier and the local reference carrier during coherent detection of the SCA information.

The use of the heterodyne circuit including the VCO 111, the balanced modulator 110 and bandpass filter 109 for selectively tuning different SCA subcarrier frequencies may introduce distortion in the in-phase signal of the demodulator 108 unless the heterodyne VCO 111 is precisely tuned so that the modulated SCA signal from the mixer 110 has its spectrum centered at the "geometric center" of the response of the bandpass filter 109. In accordance with an important aspect of the present invention, it has been found that the heterodyne VCO 111 can be precisely tuned to meet this criterion by feedback of the phase error signal from the exclusive-OR gate 126 to the VCO 111. In particular, due to the fact that the low-pass filter and comparator were removed from the quadrature-phase channel, the low-pass filter 129 should be an integrating low-pass filter that has an increasing gain for decreasing frequencies. This assures a minimal phase error between the reference carrier fed from the phase shifter 120 to the in-phase exclusive-OR gate 117 and the suppressed carrier of the hardlimited SCA signal. A schematic diagram for such an integrating low-pass filter is shown in FIG. 10 for comparison to the conventional low-pass filter of FIG. 5. The integrating low-pass filter 129 includes an operational amplifier 130 to provide the increased gain at decreased frequencies.

Returning to FIG. 8, once the feedback loop ensures phase-lock, then the frequency of the subcarrier in the modulated SCA signal from the balanced modulator 110 becomes exactly equal to the frequency of the demodulator VCO 119, and therefore the frequency of the VCO 119 can be adjusted to place the frequency of the carrier at the "geometrical center" of the response of the bandpass filter 109. The circuit of FIG. 8 can function as described even though there is no feedback of the error signal to the demodulator VCO 119, and so long as there is no feedback of a DC value to the VCO 119. To improve the ability of the receiver 90 to obtain (i.e., capture range) and maintain (i.e., loop stability) the phase-lock condition, however, it is desirable to provide loop stabilizing feedback to the demodulator VCO 119. Preferably this is done with a bandpass loop stabilizing filter 131 feeding the frequency control input of the VCO 119. When this is done, the VCO 119 is phase modulated without any shift in its average frequency to provide more rapid signal acquisition and phase lock and improve loop response and capture range, without broadening of the bandwidth of the IF filter. The bandpass filter 131 preferably has a low-frequency cutoff approximately equal to the high-frequency cutoff of the integrating low-pass filter 119.

It is interesting to note that the dual-path phase error feedback scheme of FIG. 8 allows the demodulator phase-lock-loop frequency response (determined by the bandpass loop filter 131) to be tailored independently of the noise bandwidth of the demodulator, since the noise bandwidth is determined by the bandwidth of the 455 KHz bandpass filter 109. Therefore, the bandpass filter 109 can be relatively narrow to reject noise and distortion from the SCA signal.

In view of the above, there has been disclosed an FM-SCA digital data receiver that is especially adapted for use in a paging system wherein paging data is in an SCA signal transmitted by a pre-existing FM broadcast station. Moreover, there has been disclosed such an FM-SCA receiver which is capable of receiving paging information from a selected one of a number of SCA channels for a given broadcast station, and has the capability of automatically tuning to different FM stations until a station is found which transmits paging information according to the pre-established format. For use in such a receiver, a BSPK demodulator has been described which uses digital logic components for phase shifting, phase detection and modulation, and is therefore capable of low power operation and suitable for integration as is especially important for use in a pager receiver. Moreover, a noise detection and phase error feedback inhibiting circuit has been disclosed for use in such a BPSK demodulator to ensure coherent demodulation at low signal-to-noise conditions such as are caused by multi-path propagation of the transmitted FM signal.

What is claimed is:

1. A receiver system for receiving an FM signal generated by frequency modulating an FM radio-frequency carrier with a BPSK (binary-phase-shift-keyed) signal, said BPSK signal including data at a predetermined data rate modulated on a BPSK carrier, wherein the BPSK signal includes phase reversals in said BPSK carrier responsive to a transmitted binary data stream, said receiver system comprising, in combination, means for detecting the BPSK signal from the FM signal, said means including circuitry for radio-frequency reception, FM demodulation, bandpass filtering to select the BPSK signal resulting from FM demodulation, and hardlimiting the selected BPSK signal, and demodulator circuitry for detecting the binary data stream from the hardlimited BPSK signal, said demodulator circuitry including local frequency generating means, phase shifting means, and detector means for generating multiplication products of the hardlimited BPSK signal and a locally generated frequency at approximately the frequency of the carrier of the hardlimited BPSK signal and approximately in phase and in phase quadrature with the carrier of the hardlimited BPSK signal to generate respective in-phase and quadrature-phase signals, means for filtering and hardlimiting said in-phase signal, said hardlimited in-phase signal providing a detected binary data stream, and feedback means for controlling said local frequency generating means, said feedback means including a feedback modulator for generating a phase error signal fed back to said local frequency generating means, and said feedback means receiving said quadrature-phase signal and modulating its polarity in response to said detected binary data stream.

2. The receiver system as claimed in claim 1, wherein said phase shifting means includes means for generating a first modulating signal at said locally generated frequency and a second modulating signal in phase quadrature with said first modulating signal, and wherein said detector means comprise:

a first exclusive-OR gate receiving said hardlimited BPSK signal and said first modulating signal and generating said in-phase signal, and a second exclusive-OR gate receiving said hardlimited BPSK signal and said second modulating signal and generating said quadrature-phase signal.

3. The receiver system as claimed in claim 2, wherein said feedback modulator generating said phase error signal comprises an exclusive-OR gate receiving said quadrature-phase signal and said detected data and reproducing the error signal with a polarity controlled by said detected data.

4. The receiver system as claimed in claim 3, further comprising means for filtering and hardlimiting said quadrature-phase signal, said filtered and hardlimited quadrature-phase signal being received by said feedback modulator.

5. The receiver system as claimed in claim 2, wherein said phase-shifting means includes a two-stage binary ring counter.

6. The receiver system as claimed in claim 1, further comprising means responsive to the filtered in-phase signal for disabling the feeding of said phase error signal back to said local frequency generating means under low signal-to-noise conditions.

7. The receiver system as claimed in claim 6, wherein said means for disabling the feeding of said error signal back to said local frequency generating means comprises an analog transmission gate controlling transmission of said phase error signal from said feedback means to said local frequency generating means.

8. The receiver system as claimed in claim 6, wherein said means for disabling the feeding of said phase error signal back to said local frequency generating means includes means for comparing said filtered in-phase signal to high and low threshold levels to detect the low signal-to-noise conditions.

9. The receiver system as claimed in claim 8, wherein the feeding of said phase error signal back to said local frequency generating means is disabled when the amplitude of said filtered in-phase signal falls between said high and low threshold levels.

10. The receiver system as claimed in claim 1, wherein said circuitry for bandpass filtering to select the BPSK signal resulting from FM demodulation includes means for generating a selected frequency, means for multiplying signals from FM demodulation by the selected frequency to obtain product signals, and a bandpass filter for selecting the BPSK signal from the product signals.

11. The receiver system as claimed in claim 10, wherein said means for multiplying includes a balanced mixer.

12. The receiver system as claimed in claim 10, further comprising a bandpass filter through which said phase error signal is fed back to said local frequency generating means, and a low-pass filter through which said phase error signal is fed back to said means for generating a selected frequency.

13. The receiver system as claimed in claim 10, further comprising an amplitude modulation detector responsive to the signal selected by said bandpass filter, and wherein said means for generating a selected frequency includes means for receiving a tuning control signal to permit tuning of said receiver to maximize the amount of amplitude modulation detected by said amplitude modulation detector.

14. A circuit for demodulating a BPSK (binary-phase shift-keyed) signal, said BPSK signal including data at a predetermined rate modulated on a BPSK carrier, wherein the BPSK signal includes phase reversals in said BPSK carrier responsive to a transmitted binary data stream, said BPSK modulator comprising, in combination:

means for hardlimiting said BPSK signal, local frequency generating means, phase shifting means, and detector means for generating multiplication products of the hardlimited BPSK signal and a locally generated frequency at approximately the frequency of the carrier of the hardlimited BPSK signal and approximately in phase and in phase quadrature with the carrier of the hardlimited BPSK signal to generate respective in-phase and quadrature-phase signals, wherein said detector means comprise a pair of respective exclusive-OR gates for generating said in-phase and quadrature-phase signals, means for filtering and hardlimiting said in-phase signal, said hardlimited in-phase signal providing a detected binary data stream, and an exclusive-OR gate for receiving said quadrature-phase signal and modulating its polarity in response to said detected binary data stream, to thereby generate a phase error signal indicating the phase difference between the phase of said locally generated frequency and the phase of the carrier of said hardlimited BPSK signal.

15. The circuit as claimed in claim 14, further comprising means for filtering and hardlimiting said quadrature-phase signal, the filtered and hardlimited quadrature-phase signal being received by said exclusive-OR gate for generating said phase error signal.

16. The circuit as claimed in claim 14, wherein said phase-shifting means includes a two-stage binary ring counter having a first output feeding a first modulating signal to one of said exclusive-OR gates of said detector means, and a second output feeding a second modulating signal to the other of said exclusive-OR gates of said detector means, said first and second modulating signals being in phase quadrature with respect to each other.

17. The circuit as claimed in claim 14, further comprising means for sensing the amplitude of said filtered in-phase signal for providing a signal indicating low signal-to-noise conditions.

18. The circuit as claimed in claim 17, further comprising means for reducing the phase difference between the phase of the carrier of the hardlimited BPSK signal and the phase of said local frequency in response to said phase error signal in the absence of said signal indicating low signal-to-noise conditions.

19. The circuit as claimed in claim 17, wherein said means for sensing the amplitude of said filtered in-phase signal comprises means for comparing said filtered in-phase signal to high and low threshold levels.

20. The circuit as claimed in claim 14, further comprising means for reducing the phase difference between the phase of the carrier of the hardlimited BPSK signal and the phase of said local frequency in response to said phase error signal.

21. The circuit as claimed in claim 20, wherein said means for reducing the phase difference includes means for adjusting the frequency of said local frequency generating means in response to said phase error signal.

22. The circuit as claimed in claim 20, wherein said means for reducing the phase difference includes means for shifting the frequency of said hardlimited BPSK signal in response to said phase error signal.

23. The circuit as claimed in claim 22, wherein said means for shifting the frequency of said hardlimited BPSK signal includes a heterodyne variable-frequency oscillator having a frequency of oscillation responsive to said phase error signal, a balanced mixer for mixing said frequency of oscillation with said BPSK signal, and a bandpass filter for selecting the frequency-shifted BPSK signal produced by said mixer, and wherein the frequency-shifted BPSK signal is hardlimited by said means for hardlimiting said BPSK signal.

24. The circuit as claimed in claim 23, further comprising an amplitude modulation detector for sensing the amplitude of the signal selected by said bandpass filter, and wherein said heterodyne variable-frequency oscillator includes a tuning control input for adjusting said frequency of oscillation for a maximum amplitude detection by said amplitude modulation detector.

25. The circuit as claimed in claim 23, further comprising a low-pass filter for filtering said phase error signal, the low-pass filtered phase error signal being fed to said heterodyne variable-frequency oscillator.

26. The circuit as claimed in claim 25, further comprising a bandpass filter for filtering said phase error signal, and further comprising means for adjusting the frequency of said local frequency generating means in response to the bandpass-filtered phase error signal, so that said local frequency generating means is phase modulated by said phase error signal to improve tracking of the BPSK signal while the average frequency of said local frequency generating means remains constant and the carrier frequency of said frequency-shifted BPSK signal remains centered within the passband of said bandpass filter for selecting the frequency-shifted BPSK signal.

27. A digital data receiver for receiving an FM broadcast band signal generated by frequency modulating an FM radio-frequency carrier with at least one SCA (Subsidiary Communications Authorization) signal, said SCA signal being generated by modulating a subcarrier with digital data, said receiver comprising, in combination, means for radio-frequency reception of said FM broadcast band signal, means for FM demodulation, means for selecting said SCA signal resulting from FM demodulation, and means for detecting said digital data included in the selected SCA signal, wherein said means for detecting said digital data receives said SCA signal over a substantially fixed band of frequencies, and wherein said means for selecting said SCA signal is tuneable over a relatively wide range compared to the width of said substantially fixed band of frequencies, and wherein said means for selecting said SCA signal includes a heterodyne variable-frequency oscillator tuneable over a relatively wide range of frequencies for selecting the frequency of the SCA signal to be detected, and a balanced mixer for modulating the SCA signal resulting from FM demodulation by the frequency of oscillation of said heterodyne variable frequency oscillator, wherein the modulated SCA signal is detected by said means for detecting said digital data included in said modulated SCA signal.

28. The digital data receiver as claimed in claim 27, wherein said heterodyne variable frequency oscillator is tuneable over a frequency range of about 50 kilohertz.

29. The digital data receiver as claimed in claim 27, further comprising a high-pass filter for removing audio program material from signals resulting from FM demodulation, said high-pass filter having an output passing said SCA signal to said balanced mixer.

30. The digital data receiver as claimed in claim 27, wherein said means for FM reception is adjustably tuneable to said FM broadcast band signal, and further comprising a bandpass filter tuned to a frequency in excess of the frequency of the SCA signal resulting from FM demodulation, and an amplitude modulation detector, said bandpass filter passing noise and distortion resulting from FM demodulation to said amplitude modulation detector, said amplitude modulation detector having an output indicating the amplitude of the noise and distortion to permit tuning of said means for FM reception to minimize the indicated amplitude of the noise and distortion.

31. The digital data receiver as claimed in claim 27, further comprising a bandpass filter tuned over approximately said substantially fixed band of frequencies, said bandpass filter having an output coupled to an amplitude modulation detector for providing an SCA signal strength indication, and wherein said heterodyne variable frequency oscillator includes a frequency control input for tuning said heterodyne variable frequency oscillator to maximize the SCA signal strength indication.

32. The digital data receiver as claimed in claim 31, further comprising a hardlimiter receiving the output of said bandpass filter and hardlimiting the subcarrier information signal, the hardlimited subcarrier information signal being received by said means for detecting said digital data included in said SCA signal.

33. The digital data receiver as claimed in claim 27, wherein said SCA signal is generated by modulating the phase of said SCA subcarrier, and said means for detecting said digital data includes means for coherently detecting said digital data by comparing said modulated SCA signal to a local reference carrier and means for generating a phase error signal, and a low-pass filter through which said phase error signal is fed back to adjust the frequency of said heterodyne variable frequency oscillator.

34. The digital data receiver as claimed in claim 33, wherein said low-pass filter is an integrating low-pass filter.

35. The digital data receiver as claimed in claim 33, wherein said means for detecting said digital data further includes a local oscillator for generating said local reference carrier, said local oscillator having a frequency control input, and a bandpass filter through which said phase error signal is fed back to said frequency control input.

36. The digital data receiver as claimed in claim 33, wherein said means for detecting said digital data includes means for sensing the amplitude of the portion of the modulated SCA signal that is phase coherent with said reference carrier, and means for inhibiting the feeding back of said phase error signal in response to the sensed amplitude falling below a threshold level.

37. The digital data receiver as claimed in claim 36, wherein said means for detecting said digital data includes an exclusive-OR gate for comparing said modulated SCA signal to said local reference carrier to provide an in-phase signal, and a low-pass filter for filtering said in-phase signal to provide a signal indicating the portion of the modulated SCA signal that is phase coherent with said local reference carrier.

38. A digital data receiver for receiving an FM broadcast band signal generated by frequency modulating an FM radio-frequency carrier with at least one SCA (Subsidiary Communications Authorization) signal, said SCA signal being generated by phase modulating a subcarrier with digital data, said receiver comprising, in combination,
   means for radio-frequency reception of said FM broadcast band signal, means for FM demodulation, and means for detecting said digital data included in the SCA signal resulting from FM demodulation,
   wherein said means for detecting said digital data includes means for coherently detecting said digital data by comparing the phase of said SCA signal resulting from FM demodulation to the phase of a local reference carrier, means for generating a phase error signal, and means for adjusting the phase of the local reference carrier relative to the phase of the subcarrier of the SCA signal resulting from FM demodulation, wherein said phase error signal is filtered and fed back to said means for adjusting the phase in order to maintain a phase-lock condition, and
   wherein said means for detecting said digital data includes means for sensing the amplitude of the portion of the SCA signal resulting from FM demodulation that is phase coherent with said reference carrier, and means for inhibiting the feeding back of said phase error signal in response to the sensed amplitude falling below a threshold level, to thereby maintain the phase of the local reference carrier substantially fixed during low signal-to-noise conditions.

39. The digital data receiver as claimed in claim 38, wherein said means for detecting said digital data includes an exclusive-OR gate for comparing said signal resulting from FM demodulation to a reference signal to provide an in-phase signal, and a low-pass filter for filtering said in-phase signal to provide a signal indicating the portion of the SCA signal resulting from FM demodulation that is phase coherent with said local reference carrier.

40. The digital data receiver as claimed in claim 39, wherein said means for detecting said digital data further includes means for generating a selected frequency, means for multiplying signals from FM demodulation by the selected frequency to obtain product signals, a bandpass filter for selecting the SCA signal from the product signals, and a limiter for hardlimiting the selected SCA signal, the hardlimited SCA signal being fed to said exclusive-OR gate, wherein said means for adjusting the phase of the local reference carrier includes means responsive to the filtered phase error signal for adjusting the frequency generated by said means for generating a selected frequency.

41. The digital data receiver as claimed in claim 40, wherein said means for adjusting the phase of the local reference carrier further includes means for adjusting the frequency of said reference signal in response to the filtered phase error signal.

42. The digital data receiver as claimed in claim 41, wherein the frequency generated by the said means for generating a selected frequency is adjusted in response to low-pass filtering of said phase error signal, and the frequency of said reference signal is adjusted in response to bandpass filtering of said phase error signal.

43. A method of tuning an FM receiver of the kind having circuits for radio-frequency reception including a tuning means for tuning the circuits for reception of an FM signal at a preassigned carrier frequency, said circuits for radio-frequency reception also including a demodulator for demodulating said FM signal, wherein said FM signal is generated by frequency modulating a carrier at said preassigned carrier frequency with a bandlimited signal including frequencies up to a certain maximum frequency, and wherein said demodulator provides a demodulated signal including said bandlimited signal and noise and distortion at frequencies in excess of said maximum frequency, said method tuning said receiver so as to receive said FM signal with a minimum of distortion in said demodulated signal and comprising the steps of
   (a) selecting the noise and distortion at certain frequencies in excess of said maximum frequency by bandpass filtering said demodulated signal to selected said certain frequencies in excess of said maximum frequency, and by detecting the amplitude of the signal including the selected frequencies, and (b) operating said tuning means so that the noise and distortion measured in step (a) is a minimum.

44. The method as claimed in claim 43, wherein said tuning means includes electronic tuning means responsive to a tuning control voltage and said tuning control voltage is adjusted by a microcomputer which reads the detected amplitude.

45. The method as claimed in claim 44, wherein said microcomputer successively reads the detected amplitude and changes the tuning control voltage to a different value, again reads the detected amplitude, compares the newly detected amplitude to the amplitude having been stored, and resets the tuning control voltage to the previous value in the event that the amplitude having been stored is less than the newly detected amplitude.

* * * * *